(12) United States Patent
Suzuki et al.

(10) Patent No.: US 9,966,283 B2
(45) Date of Patent: May 8, 2018

(54) PRESSURIZING-TYPE LAMP ANNEALING DEVICE, METHOD FOR PRODUCING THIN FILM, AND METHOD FOR USING PRESSURIZING-TYPE LAMP ANNEALING DEVICE

(75) Inventors: Mitsuhiro Suzuki, Nagareyama (JP); Takeshi Kijima, Nagareyama (JP); Yuuji Honda, Nagareyama (JP)

(73) Assignee: YOUTEC CO., LTD., Chiba (JP)

( * ) Notice: Subject to any disclaimer, the term of this patent is extended or adjusted under 35 U.S.C. 154(b) by 449 days.

(21) Appl. No.: 13/579,394

(22) PCT Filed: Aug. 2, 2010

(86) PCT No.: PCT/JP2010/063443
§ 371 (c)(1),
(2), (4) Date: Oct. 18, 2012

(87) PCT Pub. No.: WO2011/104904
PCT Pub. Date: Sep. 1, 2011

(65) Prior Publication Data
US 2013/0026152 A1 Jan. 31, 2013

(30) Foreign Application Priority Data
Feb. 23, 2010 (JP) ................................. 2010-037542

(51) Int. Cl.
*H05B 3/02* (2006.01)
*H01L 21/67* (2006.01)
(Continued)

(52) U.S. Cl.
CPC .. *H01L 21/67115* (2013.01); *H01L 21/02197* (2013.01); *H01L 21/02337* (2013.01); *H01L 21/02356* (2013.01); *H01L 21/324* (2013.01)

(58) Field of Classification Search
CPC ......... H01L 21/02197; H01L 21/02337; H01L 21/02356; H01L 21/324; H01L 21/67115
(Continued)

(56) References Cited

U.S. PATENT DOCUMENTS 4,482,842 A * 11/1984 Fujimura et al. ............. 313/634
5,340,089 A *  8/1994 Heath .................... B01J 8/1836
                                              266/249
(Continued)

FOREIGN PATENT DOCUMENTS

JP          07-130677      *  5/1995
JP           7-130677          5/1995
(Continued)

OTHER PUBLICATIONS

International Search Report dated Nov. 9, 2010 in International (PCT) Application No. PCT/JP2010/063443.

*Primary Examiner* — Dana Ross
*Assistant Examiner* — Joseph Iskra
(74) *Attorney, Agent, or Firm* — Wenderoth, Lind & Ponack, L.L.P.

(57) ABSTRACT

A pressurizing-type lamp annealing device which can easily handle a substrate to be treated having a large surface area. An embodiment of the pressurizing-type lamp annealing device includes: a treatment chamber (25); a holding part (23) disposed in the treatment chamber to hold a substrate to be treated; a gas-introduction mechanism for introducing a pressurized gas into the treatment chamber; a gas-discharge mechanism for discharging the gas in the treatment chamber; a transparent tube (20) disposed in the treatment chamber; and a lamp heater (19) placed in the treatment chamber to irradiate the substrate with a lamp light through the transparent tube.

11 Claims, 10 Drawing Sheets

(51) Int. Cl.
*H01L 21/02* (2006.01)
*H01L 21/324* (2006.01)

(58) Field of Classification Search
USPC ........ 219/243, 390, 405, 411; 118/724, 725; 392/416, 418
See application file for complete search history.

(56) References Cited

U.S. PATENT DOCUMENTS

| | | | |
|---|---|---|---|
| 6,479,801 B1* | 11/2002 | Shigeoka et al. | 219/502 |
| 6,600,138 B2* | 7/2003 | Hauf et al. | 219/411 |
| 6,623,865 B1* | 9/2003 | Zou | C04B 37/021 428/472 |
| 6,707,011 B2* | 3/2004 | Tay | H05B 3/0047 118/50.1 |
| 2002/0102859 A1* | 8/2002 | Yoo | C23C 16/481 438/758 |
| 2002/0148824 A1 | 10/2002 | Hauf et al. | |
| 2003/0047133 A1* | 3/2003 | Lim et al. | 118/50.1 |
| 2003/0094446 A1 | 5/2003 | Tay et al. | |
| 2007/0095289 A1* | 5/2007 | Arami | 118/725 |

FOREIGN PATENT DOCUMENTS

| | | | |
|---|---|---|---|
| JP | 2005-503003 | | 1/2005 |
| JP | 2005-101228 | | 4/2005 |
| JP | 2005-229028 | * | 8/2005 |
| WO | 2006/087777 | | 8/2006 |
| WO | WO2006087777 | * | 8/2006 |

* cited by examiner

PRESSURIZING-TYPE LAMP ANNEALING DEVICE, METHOD FOR PRODUCING THIN FILM, AND METHOD FOR USING PRESSURIZING-TYPE LAMP ANNEALING DEVICE

BACKGROUND OF THE INVENTION

1. Technical Field

The present invention relates to a pressuring-type lamp annealing device, a method for producing a thin film using the same, and a method for using a pressurizing-type lamp annealing device.

2. Description of the Related Art

Figure 12:
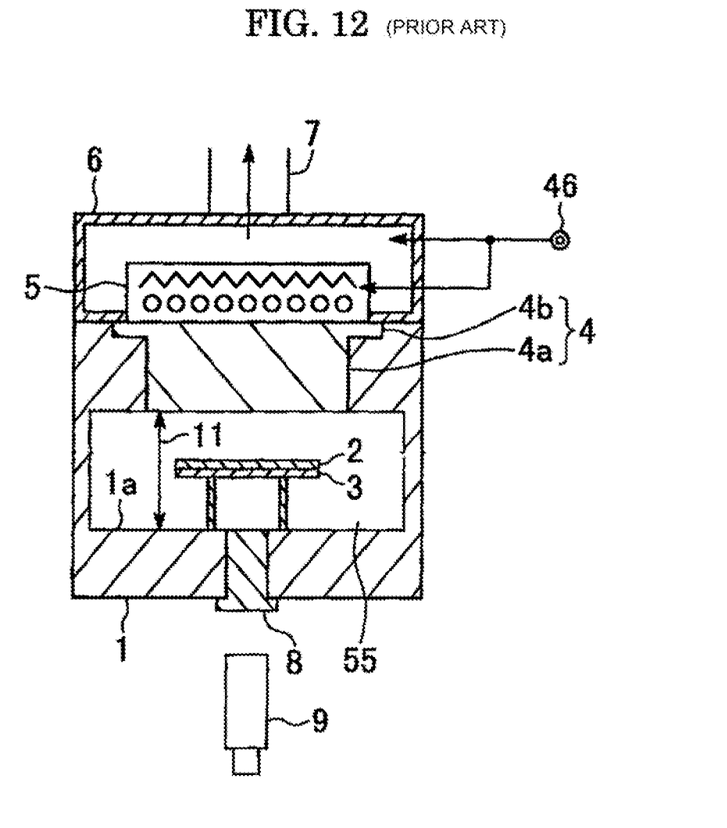
FIG. 12 is a cross-sectional view illustrating a configuration of a conventional pressurizing-type lamp annealing device.

FIG. 12 is a cross-sectional view illustrating the configuration of a pressurizing-type lamp annealing device in prior art.

The pressurizing-type lamp annealing device has an aluminum-made chamber 1. An inner surface 1a of the chamber 1 is subjected to a surface treatment.

The chamber 1 is provided with a stage 3 for placing a wafer 2 as a substrate to be treated thereon. The stage 3 is formed of a material which allows a lamp light to permeate therethrough, such as quartz. Above the stage 3, a quartz glass 4 is disposed. The quartz glass 4 is configured by a near-cylindrical part 4a and a flange part 4b formed at upper periphery of the near-cylindrical part 4a. The near-cylindrical part 4a formed of quartz glass is thick because the inside of the chamber is pressurized.

The thickness of the near-cylindrical part 4a of the quartz glass is determined by the following method.

When the design pressure (for example, work pressure× 1.2) is set to P (unit: Pa), the area being subjected to the pressure is set to A (unit: mm$^2$), and the bending stress of the quartz glass is set to σb (unit: N/mm$^2$), the thickness of the quartz glass t, preferably satisfies the following formula (1).

$$10(PA/\sigma b)^{1/2} \leq t \leq 75(PA/\sigma b)^{1/2} \quad (1)$$

A lamp heater 5 is disposed on the quartz glass 4, and the lamp heater 5 is disposed within a casing 6 formed of metal. A gas-discharge duct 7 is connected to the upper part of the casing 6, for releasing heat within the casing 6.

Each of the casing 6 and the lamp heater 5 is connected with a dry-air supply source 46 via a piping. By introducing dry air from the dry-air supply source 46 into the casing and into the lamp heater, the heat remaining in the casing and in the lamp heater can be released via the gas-discharge duct 7.

At the lower part of the chamber 1 positioned below the stage 3, there is provided a window, and calcium fluoride 8 is placed in the window. Below the calcium fluoride 8, a radiation thermometer 9 is disposed.

A treatment chamber 55 being formed in the chamber 1 is preferably small because smaller treatment chamber 55 makes it possible to reduce the time required to pressurize the treatment chamber 55 to a specified level. Furthermore, a height 11 of the treatment chamber 55 is preferably low because lower height makes it possible to shorten the distance between the wafer 2 disposed within the treatment chamber 55 and the lamp heater 5, which allows increasing the temperature-rise rate. (Refer to WO2006/087777 (paragraphs 0020-0035, FIG. 1), for example.)

SUMMARY OF THE INVENTION

1. Problems to be Solved by the Invention

Incidentally, there is required a pressurizing-type lamp annealing device which can perform annealing on a large surface substrate to be treated. The above-described pressurizing-type lamp annealing device of prior art, however, makes it difficult to handle large substrates to be treated. The difficulty will be described below.

According to the above-described conventional pressurizing-type lamp annealing device, increase in the surface area of substrate to be treated increases the area A of the surface being subjected to the pressure, in the formula (1), and thus the thickness of the near-cylindrical part 4a of quartz glass is required to be increased in accordance with the increase in the area A. Then, when the thickness of the quartz glass increases, the output of the lamp heater 5 has to be increased in order to cause the lamp light to pass through the thick quartz glass. If the thickness of the quartz glass is doubled, the intensity of lamp light passing through the quartz glass is weakened by four-fold. That is, the intensity of lamp light passing through the quartz glass is weakened by square of the thickness of quartz glass. Consequently, the above-described conventional pressurizing-type lamp annealing device makes it difficult to handle a substrate to be treated having a large surface area.

An aspect of the present invention has an object to provide a pressurizing-type lamp annealing device which can easily handle a substrate to be treated having a large surface area, a method for producing a thin film using the same, and a method for using a pressurizing-type lamp annealing device.

2. Means to Solve the Problems

An aspect of the present invention is a pressurizing-type lamp annealing device including:

a treatment chamber;

a holding part disposed into the treatment chamber to hold a substrate to be treated;

a gas-introduction mechanism for introducing a pressurized gas into the treatment chamber;

a gas-discharge mechanism for discharging the gas in the treatment chamber;

a transparent tube disposed into the treatment chamber; and a lamp heater placed in the transparent tube to irradiate the substrate to be treated with a lamp light, through the transparent tube.

According to the above pressurizing-type lamp annealing device, the configuration is such that the transparent tube is disposed into the treatment chamber, the lamp heater is placed in the transparent tube, and the substrate to be treated is irradiated with the lamp light, through the transparent tube. With this configuration, the output of the lamp heater is not required to be increased in order to cause the lamp light to pass through the thick quartz glass as in the case of the conventional pressurizing-type lamp annealing device. Consequently, smaller output of lamp heater than that of the conventional pressurizing-type lamp annealing device makes it possible to perform annealing on a substrate to be treated having a large surface area.

In the pressurizing-type lamp annealing device of the above aspect of the present invention, an inner wall of the treatment chamber has a curved face along an outer surface of the transparent tube, and the transparent tube is preferably disposed that the outer surface thereof contacts the curved face.

In addition, the pressurizing-type lamp annealing device of the above aspect of the present invention, each end of the transparent tube is preferably connected to outside of the treatment chamber. With this configuration, a cooling gas is allowed to flow through the transparent tube, and thus the lamp heater is easily cooled.

Another aspect of the present invention is a pressurizing-type lamp annealing device which includes:

a chamber;

a stage disposed into the chamber to hold a substrate to be treated positioned at a lower part of the chamber;

a gas-introduction mechanism for introducing a pressurized gas into the chamber;

a gas-discharge mechanism for discharging the gas in the chamber;

a transparent tube disposed into the chamber; and a lamp heater placed in the transparent tube, wherein a groove is formed on an upper inner wall of the chamber, the inner wall of the groove has a curved face along the outer surface of the transparent tube, the transparent tube is disposed into the groove in a state where the outer surface thereof contacts the curved face, each end of the transparent tube is connected to outside of the chamber, and the substrate to be treated held by the stage is irradiated with a lamp light of the lamp heater, through the transparent tube.

Still another aspect of the present invention is a method for producing a thin film including the steps of:

preparing a substrate to be treated having a thin-film material on a surface thereof; and performing annealing treatment on the thin-film material through the use of the pressurizing-type lamp annealing device according to any of above-described pressurizing-type lamp annealing devices.

In accordance with the above-described method for producing a thin film, there can be produced a thin film on a substrate to be treated having a large surface area thereof, with smaller electric power consumption. It should be noted that an example of the thin film given here is an organic metal material.

In addition, in the method for producing a thin film of above-described aspect of the present invention, the annealing treatment can also be a pressure annealing treatment in which the gas-introduction mechanism sets the inside of the chamber to a pressurized atmosphere; and the lamp heater irradiates the thin-film material with the lamp light, through the transparent tube.

Furthermore, in the method for producing a thin film of above-described aspect of the present invention, a reduced-pressure annealing treatment can also be performed in which, before or after the pressure annealing treatment, the gas-discharge mechanism sets the inside of the chamber to a reduced-pressure atmosphere; and the lamp heater irradiates the thin-film material with the lamp light, through the transparent tube.

Moreover, in the method for producing a thin film of the above-described aspect of the present invention, an atmospheric pressure annealing treatment can also be performed in which, before or after the pressure annealing treatment, the inside of the chamber is set to an atmospheric pressure atmosphere; and the lamp heater irradiates the thin-film material with the lamp light, through the transparent tube.

Further aspect of the present invention is a method for using the pressurizing-type lamp annealing device according to any of the above aspects, wherein a substrate to be treated is held on the holding part, at least one of the pressure annealing treatment, the reduced-pressure annealing treatment, and the atmospheric pressure annealing treatment is performed on the substrate to be treated, the pressure annealing treatment is a treatment in which the gas-introduction mechanism sets the inside of the chamber to a pressurized atmosphere; and the lamp heater irradiates the substrate to be treated with the lamp light, through the transparent tube, the reduced-pressure annealing treatment is a treatment in which gas-discharge mechanism sets the inside of the chamber to a reduced-pressure atmosphere; and the lamp heater irradiates the substrate to be treated with the lamp light, through the transparent tube, and the atmospheric pressure annealing treatment is a treatment in which the inside of the chamber is set to an atmospheric pressure atmosphere; and the lamp heater irradiates the substrate to be treated with the lamp light, through the transparent tube.

3. Effect of the Invention

According to any of the aspects of the present invention, there can be provided a pressurizing-type lamp annealing device which can easily handle a substrate to be treated having a large surface area, a method for producing a thin film using the same, and a method for using a pressurizing-type lamp annealing device.

DETAILED DESCRIPTION OF THE INVENTION

Hereinafter, embodiments of the present invention will be described in detail referring to the drawings. The present invention is, however, not limited to the following description, and a person skilled in the art would readily understand that the embodiments and the detail thereof can be modified variously without departing from the purport and the scope of the present invention. Therefore, the present invention is not to be understood as being limited to the description of the following embodiments.

First Embodiment

Figure 1:
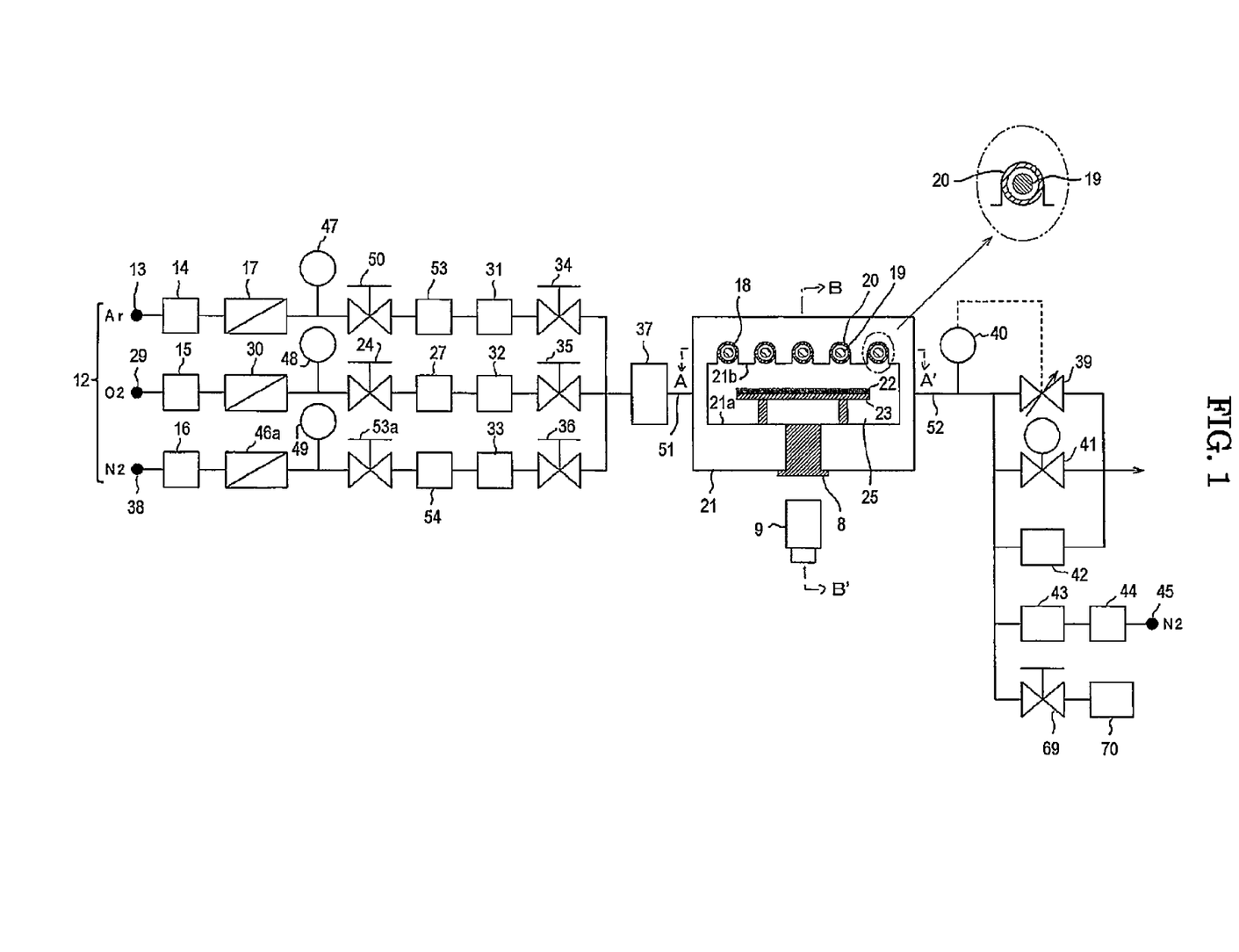
FIG. 1 is a cross-sectional view illustrating a configuration of the pressurizing-type lamp annealing device according to an embodiment of the invention.

FIG. 1 is a cross-sectional view illustrating the configuration of the pressurizing-type lamp annealing device according to the first embodiment.

Figure 2:
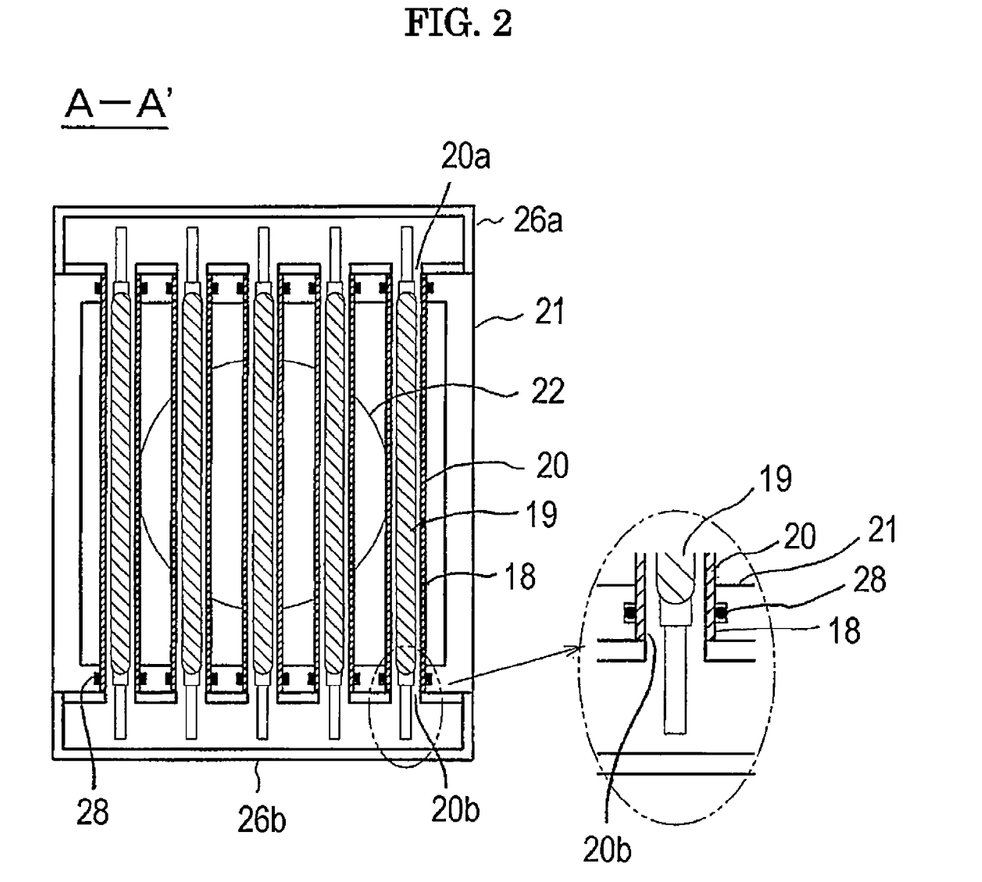
FIG. 2 is a cross-sectional view of section A-A' shown in FIG. 1.
Figure 3:
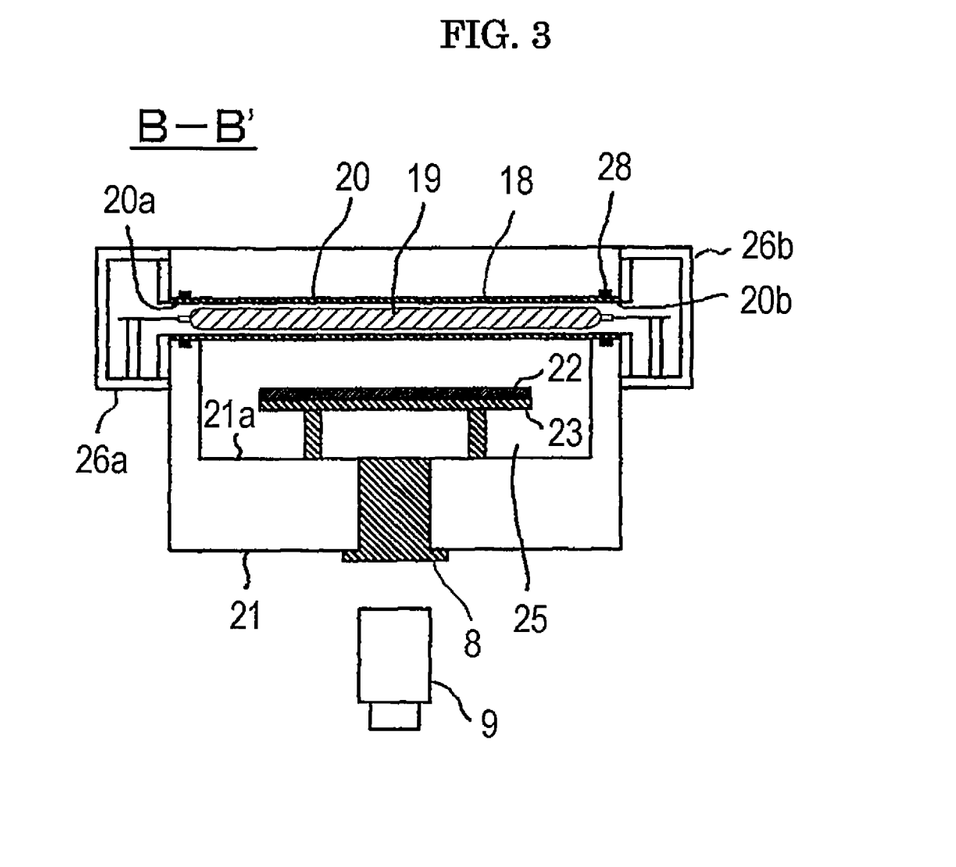
FIG. 3 is a cross-sectional view of section B-B' shown in FIG. 1.

FIG. 2 is a cross-sectional view of section A-A' shown in FIG. 1. FIG. 3 is a cross-sectional view of section B-B' shown in FIG. 1.

As illustrated in FIGS. 1 to 3, the pressurizing-type lamp annealing device has an aluminum-made chamber 21, and a treatment chamber 25 is formed within the chamber 21. An inner surface 21a of the chamber 21 is subjected to a surface treatment. That is, a reflection film is formed on the inner surface 21a of the chamber 21. Au-plating or oxalic acid alumite treatment can be used as the specific surface treatment. Because of this, an Au-plating film or an oxalic acid alumite film is formed on the inner surface 21a of the chamber 21 and this Au-plating film or oxalic acid alumite film can reflect the lamp light, and thus the temperature-rise rate can be increased and further the electric power consumption can be decreased. In addition, the chamber 21 is configured to be cooled by water through the use of a cooling mechanism (not shown).

Meanwhile, according to the embodiment, Au-plating or oxalic acid alumite treatment is used as the surface treatment, but the present invention is not limited to the Au-plating and the oxalic acid alumite treatment, and there can also be used a coating film containing, as a main component, a metal selected from the group consisting of Al, Au, Ag, Cu, Pt, and Ti.

Within the chamber 21, there is provided a stage (holding part) 23 for placing a wafer 22 thereon as the substrate to be treated. The stage 23 is formed by a material causing the lamp light to pass therethrough, such as quartz. Pluralities of transparent tubes 20 are disposed above the stage 23, and these transparent tubes 20 are formed by a material causing the lamp light to pass therethrough, such as quartz. Inside each of the pluralities of transparent tubes 20, a lamp heater 19 is disposed.

A groove 18 is formed on an upper inner wall 21b of the chamber 21, and the inner wall of the groove 18 has a curved face along the outer surface of the transparent tube 20. With this configuration, the transparent tube 20 can be disposed within the groove 18 in a state where the outer surface of the transparent tube 20 contacts the curved face of the inner wall of the groove 18. The wafer 22 held by the stage 23 is configured to be irradiated with the lamp light of the lamp heater 19, through the transparent tube 20.

As illustrated in FIG. 2 and FIG. 3, an end 20a of the transparent tube 20 is connected to an inside part of a first casing 26a made up of a metal being positioned outside the chamber 21, while the other end 20b of the transparent tube 20 is connected to an inside part of a second casing 26b made up of a metal being positioned outside the chamber 21. A gas-discharge duct (not shown) is connected to the first casing 26a, and this gas-discharge duct releases heat inside each of the first casing 26a, the transparent tubes 20, and the second casing 26b.

Between the chamber 21 and each end 20a and 20b of the transparent tube 20, there are disposed respective white O-rings 28. The O-rings 28 secure a hermetic seal in the treatment chamber 25. A white O-ring 28 is used because the use of, for example, a black O-ring causes the lamp light of the lamp heater 19 to melt the O-ring, while the use of the white O-ring makes it possible to suppress melting of the O-ring under the lamp light.

At the lower part of the chamber 21 positioned below the stage 23, a window is disposed, and the window is filled with calcium fluoride 8. Below the calcium fluoride 8, a radiation thermometer 9 is disposed. The calcium fluoride 8 is placed for taking in light in the measuring wavelength range (infrared ray having a wavelength of 5 μm) in order to determine the temperature of the substrate to be treated using the radiation thermometer 9.

The treatment chamber 25 formed within the chamber 21 is preferably small because smaller treatment chamber 25 makes it possible to reduce the time required to pressurize or reduce of pressure of the treatment chamber 25 to a specified level. Furthermore, the height of the treatment chamber 25 is preferably low because lower height makes it possible to shorten the distance between the wafer 22 disposed within the treatment chamber 25 and the lamp heater 19, which allows increasing the temperature-rise rate.

The treatment chamber 25 within the chamber 21 is connected to a pressurizing line (pressurizing mechanism) 12. The pressurizing line 12 has a pressurizing line by each of argon gas, a pressurizing line by oxygen gas, and a pressurizing line by nitrogen gas.

The pressurizing line by argon gas includes an argon gas supply source 13, this argon gas supply source 13 is connected to a check valve 14 via a piping, and this check valve 14 is connected to a filter 17 for removing impurities via a piping. The filter 17 is connected to a valve 50 via a piping, and this piping is connected to a pressure gauge 47. The valve 50 is connected to a regulator 53 via a piping, and this regulator 53 is connected to a mass flow controller 31 via a piping. The regulator 53 sets the pressure difference between upstream side and downstream side of the mass flow controller 31 to a specified level, by gradually increasing the gas pressure. The mass flow controller 31 is connected to a valve 34 via a piping, and this valve 34 is connected to a heating unit 37 via a piping. The heating unit 37 keeps the gas temperature (for example, approximately 40° C. to 50° C.) constant in order to stabilize the process. The heating unit 37 is connected to the treatment chamber 25 within the chamber 21 via a piping 51.

The pressurizing line by oxygen gas has a similar configuration to that of the pressurizing line by argon gas. Specifically, the pressurizing line by oxygen gas includes an oxygen gas supply source 29, the oxygen gas supply source 29 is connected to a check valve 15 via a piping, and this check valve 15 is connected to a filter 30 for removing impurities via a piping. This filter 30 is connected to a valve 24 via a piping, and this piping is connected to a pressure gauge 48. The valve 24 is connected to a regulator 27 via a piping, and this regulator 27 is connected to a mass flow controller 32 via a piping. The mass flow controller 32 is connected to a valve 35 via piping, and this valve 35 is connected to the heating unit 37 via piping. The heating unit 37 is connected to the treatment chamber 25 within the chamber 21 via the piping 51.

The pressurizing line by nitrogen gas has a similar configuration to that of the pressurizing line by argon gas. Specifically, the pressurizing line by nitrogen gas includes a nitrogen gas supply source 38, this nitrogen gas supply source 38 is connected to a check valve 16 via a piping, and this check valve 16 is connected to a filter 46a for removing impurities via piping. The filter 46a is connected to a valve 53a via piping, and this piping is connected to a pressure gauge 49. The valve 53a is connected to a regulator 54 via piping, and this regulator 54 is connected to a mass flow controller 33 via piping. The mass flow controller 33 is connected to a valve 36 via a piping, and this valve 36 is connected to the heating unit 37 via piping. The heating unit 37 is connected to the treatment chamber 25 within the chamber 21 via the piping 51.

In addition, the treatment chamber 25 within the chamber 21 is connected to a pressure-adjusting line. The pressure-adjusting line and the pressurizing lines 12 make it possible to pressurize the treatment chamber 25 within the chamber 21, to a specified level (for example, lower than 1 MPa). The pressure-adjusting line includes a variable valve 39, and an end of this variable valve 39 is connected to the treatment chamber 25 within the chamber 21 via a piping 52. The piping 52 is connected to a pressure gauge 40, and this pressure gauge 40 measures the internal pressure of the treatment chamber 25. The other end of the variable valve 39 is connected to piping.

In addition, the treatment chamber 25 within the chamber 21 is connected to a safety line. The safety line functions to decrease the internal pressure of the treatment chamber to atmospheric pressure, when the treatment chamber 25 is abnormally pressurized to exceed a specified level. The safety line includes a release valve 41. An end of this release valve 41 is connected to the treatment chamber 25 within the chamber 21 via the piping 52, while the other end of the release valve 41 is connected to piping. When a specified pressure is applied to the release valve 41, the release valve 41 allows gas to flow therethrough.

Furthermore, the treatment chamber 25 within the chamber 21 is connected to a vent line. This vent line functions to return the correctly pressurized treatment chamber 25 to atmospheric pressure. The vent line includes a release valve 42. An end of this release valve 42 is connected to the treatment chamber 25 within the chamber 21 via the piping 52, while the other end of the release valve 42 is connected to piping. The release valve 42 is configured to cause the gas within the treatment chamber 25 to flow gradually therethrough in order to return the internal pressure of the treatment chamber 25 to atmospheric pressure.

In addition, the treatment chamber 25 within the chamber 21 is connected to a line for returning from a reduced pressure to atmospheric pressure. When the treatment chamber 25 is in a reduced pressure state (vacuum state), the line functions to return the internal pressure of the treatment chamber 25 from reduced pressure (vacuum) to atmospheric pressure. The line includes a leak valve 43. An end of this leak valve 43 is connected to the treatment chamber 25 within the chamber 21 via the piping 52, while the other end of the leak valve 43 is connected to a check valve 44 via piping. The check valve 44 is connected to a nitrogen supply gas source 45 via piping. That is, the line is configured to return the internal pressure of the treatment chamber to atmospheric pressure by gradually introducing nitrogen gas from the nitrogen gas supply source 45, to the treatment chamber 25 via the check valve 44 and the leak valve 43.

Furthermore, the treatment chamber 25 within the chamber 21 is connected to an evacuation line for putting the internal pressure of the treatment chamber 25 into a reduced pressure state. The evacuation line has a valve 69, and an end of this valve 69 is connected to the treatment chamber 25 via a piping. The other end of the valve 69 is connected to a vacuum pump 70 via piping. This evacuation line is used, for example, when performing pressurized RTA (Rapid Thermal Annealing) in a reduced pressure atmosphere.

Each of the first casing 26a, the second casing 26b, and the lamp heater 19 in the transparent tube 20 is connected to a dry-air supply source (not shown) or a nitrogen gas supply source (not shown), via piping. By introducing dry air or nitrogen gas from the dry-air supply source or the nitrogen gas supply source, respectively, to the first casing 26a, the second casing 26b, and the transparent tube 20, the lamp heater 19 can be cooled, and the heat remaining in the casings and the transparent tube 20 can be released through the gas-discharge duct.

Each of argon gas, oxygen gas, and nitrogen gas introduced through the pressurizing line 12 is supplied onto the wafer 22 in a state of being distributed in a shower pattern approximately parallel to the surface of the wafer 22. The gas supplied onto the wafer is discharged through a second shower-pattern gas passages (not shown) arranged approximately parallel to the surface of the wafer 22. Specifically, the piping 51 is connected to a first shower-pattern gas passage (not shown), and the piping 52 is connected to the second shower-pattern gas passage. Both of the first shower-pattern gas passage and the second shower-pattern gas passage are formed in the chamber 21. By introducing the gas in a distributed shower-pattern and by discharging the gas through the second shower-pattern gas passage, it becomes possible to uniformly supply the gas onto the wafer 22.

A gate valve (not shown) is disposed at an end of the chamber 21, and a transfer robot (not shown) for transferring the wafer is positioned near the gate valve. A cassette (not shown) is disposed near the transfer robot to accommodate the wafer. The transfer robot carries in and out the wafer 22 to and from the treatment chamber 25 within the chamber 21 in a state of opening the gate valve.

Next, the method for using the above-described pressurizing-type lamp annealing device will be described.

The above-described pressurizing-type lamp annealing device can perform at least one of the pressure annealing treatment, the reduced-pressure annealing treatment, and the atmospheric pressure annealing treatment on the wafer 22 to be treated.

The pressure annealing treatment will be described below.

The inside of the treatment chamber 25 within the chamber is kept in a pressurized atmosphere. Specifically, for example, oxygen gas is introduced into the treatment chamber 25 from the oxygen supply source 29 in the pressurizing line 12, through the check valve 15, the filter 30, the valve 24, the regulator 27, the mass flow controller 32, the valve 35, the heating unit 37, and the piping 51. Along with this, by the gradual closing of the variable valve in the pressure-adjusting line, the inside of the treatment chamber 25 is gradually pressurized while being put into an oxygen atmosphere therein. Then, the inside of the treatment chamber 25 is pressurized to a specified level lower than 1 MPa, and is maintained at the pressure. Next, by the fact that the lamp heater 19 irradiates the wafer 22 with the lamp light through the transparent tube 20, the wafer 22 is subjected to the pressure annealing treatment.

The reduced-pressure annealing treatment will be described below.

The inside of the treatment chamber 25 within the chamber is kept in a reduced-pressure atmosphere. Specifically, for example, while oxygen gas is introduced into the treatment chamber 25 from the oxygen supply source 29 in the pressurizing line 12, through the check valve 15, the filter 30, the valve 24, the regulator 27, the mass flow controller 32, the valve 35, the heating unit 37, and the piping 51, the inside of the treatment chamber 25 is evacuated by using the vacuum pump 70 on the evacuation line via the valve 69 and the piping 52. While the inside of the treatment chamber 25 is kept in an oxygen atmosphere by a balance between gas introduction and gas discharge, the internal pressure of the treatment chamber 25 is reduced to a specified level. Next, by the fact that the lamp heater 19 irradiates the wafer 22 with the lamp light through the transparent tube 20, the wafer 22 is subjected to the reduced-pressure annealing treatment.

The atmospheric pressure annealing treatment will be described below.

The inside of the treatment chamber 25 within the chamber is kept in an atmospheric pressure atmosphere. Specifically, for example, while oxygen gas is introduced into the treatment chamber 25 from the oxygen supply source 29 in the pressurizing line 12, through the check valve 15, the filter 30, the valve 24, the regulator 27, the mass flow controller 32, the valve 35, the heating unit 37, and the piping 51, the inside of the treatment chamber 25 is adjusted to atmospheric pressure by using the pressure-adjusting line while the inside of the treatment chamber 25 is kept to an oxygen atmosphere. Next, by the fact that the lamp heater 19 irradiates the wafer 22 with the lamp light through the transparent tube 20, the wafer 22 is subjected to the atmospheric pressure annealing treatment.

Hereinafter, the method for producing a thin film according to the embodiment will be described.

Specifically, as an example of the method for producing electronic parts, there will be described the method for producing a PZT (lead zirconate titanate) ferroelectric capacitor which is an example of organic metal materials, through the use of the above pressurizing-type lamp annealing device.

First, a silicon oxide film ($SiO_2$ film) is formed on a 12 inch silicon wafer by the thermal oxidation process, and a lower electrode is formed on the silicon oxide film. Next, a PZT film is coated on the lower electrode by the sol-gel process, and an upper electrode is formed on this PZT film.

After that, a RTA treatment is performed in an oxygen atmosphere at 600° C. for 1 minute through the use of the above pressurizing-type lamp annealing device. The details of the procedure will be described below.

The opening part of the gate valve is opened, the transfer robot carries-in the silicon wafer to the treatment chamber 25 to place the silicon wafer on the stage 23 shown in FIG. 1. Then, the opening part of the gate valve is closed, and oxygen gas is introduced into the treatment chamber 25 from the oxygen gas supply source 29 in the pressurizing line 12, through the check valve 15, the filter 30, the valve 24, the regulator 27, the mass flow controller 32, the valve 35, the heating unit 37, and the piping 51. Along with this, by the gradual closing of the variable valve 39 in the pressure-adjusting line, the inside of the treatment chamber 25 is gradually pressurized while being put into an oxygen atmosphere therein. Then, the inside of the treatment chamber 25 is pressurized to a specified level lower than 1 MPa, and is maintained at the pressure.

Next, the lamp heater 19 irradiates the silicon wafer with the lamp light through the transparent tube 20. This rapidly heats the PZT film up to 600° C., and the temperature is held at 600° C. for 1 minute. As a result, the PZT and oxygen rapidly react with each other to thereby crystallize the PZT film.

Then, by bringing the lamp heater 19 to a stop, the PZT film is rapidly cooled. Next, the oxygen supply from the oxygen supply source in the pressurizing line 12 is stopped, and the release valve 42 in the vent line is opened and the inside of the treatment chamber 25 is returned to atmospheric pressure.

In accordance with the above RTA treatment, since the annealing treatment is performed in a pressurized state, the vaporization of low-boiling materials in PZT can be suppressed, and the reaction between PZT and oxygen can be accelerated. Furthermore, since the temperature of PZT film is instantaneously elevated to 600° C., the generation of oxygen defects in the PZT film can be suppressed, which allows an excellent crystalline PZT film to be produced.

Meanwhile, according to the embodiment, the annealing treatment of the substrate to be treated is performed in a pressurized state of the treatment chamber 25 by discharging the gas within the treatment chamber 25 while introducing oxygen gas into the treatment chamber 25 through the pressurizing line 12. However, it is also possible to stop each of the valve 35 and the variable valve 39 after pressurizing the inside of the treatment chamber 25 by discharging the gas within the treatment chamber 25 while introducing the gas into the treatment chamber 25 through the pressurizing line 12, and then to perform annealing treatment on the substrate to be treated in a pressurized state of the treatment chamber 25. In addition, these controls are performed by a control part (not shown).

According to the embodiment, the configuration is such that the transparent tube 20 is disposed within the treatment chamber 25 in the chamber 21, the lamp heater 19 is placed in the transparent tube 20, and the substrate to be treated is irradiated with the lamp light though the transparent tube 20. Because of the configuration, the output of lamp heater is not required to be increased in order to cause the lamp light to pass through a thick quartz glass as in the case of the conventional pressurizing-type lamp annealing device. That is, since the lamp heater 19 is placed in the transparent tube 20, the thickness of the transparent tube being subjected to the pressure is not required to be increased even when the surface area of the substrate to be treated becomes large. Consequently, it becomes possible to perform annealing treatment on a substrate to be treated having a large surface area thereof (for example, 12 inch silicon wafer), even when the output of the lamp heater is smaller than that of the conventional pressurizing-type lamp annealing device.

Specifically, when the conventional pressurizing-type lamp annealing device performs annealing treatment on a 12 inch silicon wafer, a quartz glass having a thickness of approximately 100 mm and a lamp heater having an output power of approximately 160 KW become necessary according to calculations. In contrast, when performing annealing treatment on a 12 inch silicon wafer by the pressurizing-type lamp annealing device of the embodiment, the transparent tube 20 having a thickness of approximately 5 mm and the lamp heater having an output power of approximately 20 KW may be used. In this way, the pressurizing-type lamp annealing device of the embodiment drastically decreases the power consumption.

Since, in the embodiment, a configuration is adopted in which the distance between the lamp heater 19 and the substrate to be treated can be shortened, the power consumption of the device can be decreased, and also the volume within the treatment chamber 25 in the chamber can be decreased even when a large substrate to be treated is dealt with.

Furthermore, since, in the embodiment, the lamp heater 19 is placed in the transparent tube 20, the lamp heater 19 is not damaged, the cooling efficiency of the lamp heater 19 is good, the exchange of lamp heater is easy, and thus good maintenance performance is provided.

Moreover, the present invention is not limited to the embodiment, and various modifications can be made within a scope not departing from the gist of the present invention. For example, as the lamp, various kinds of lamp light sources can be used, and a halogen lamp may be used as the light source, or a UV lamp such as a lamp metal halide lamp and a high-pressure mercury lamp may be used as the light source.

Furthermore, according to the above embodiment, a single lamp heater is placed in one transparent tube 20, but two or more lamp heaters can also be placed in a single transparent tube.

Furthermore, in the above embodiment, the method for fabricating a PZT ferroelectric capacitor is described, and it is also possible to apply the present invention to the fabrication of other electronic components.

Second Embodiment

Hereinafter, the method for producing a thin film according to the second embodiment will be described. The method for producing this thin film makes use of the pressurizing-type lamp annealing device illustrated in FIGS. 1 to 3.

(1) Process of Reduced Pressure+Pressurization (Sample 1), and Process of Atmospheric Pressure+Pressurization (Sample 2)

A spin coating is conducted through the use of a PZT sol-gel solution made up of ethanol solvent and having a concentration of 0.5 mol/kg, in which excessive lead ingredients by 20% are contained. Onto a 4-inch wafer having a (111)-oriented Pt film on the surface thereof, 300 μL of the solution is coated per cycle by rotational coating at 2500 rpm for 60 seconds. Next, the coated wafer is heated and held for 60 seconds on a hot plate held at 150° C., and water is removed therefrom. And then, the wafer is heated and held for 60 seconds on a hot plate held at 300° C., and an amorphous PZT is generated. The steps are repeated for total 20 times, and thus a PZT amorphous having a thickness of 2 μm is generated.

The amorphous PZT substrate after being temporary burning undergoes PZT crystallization through the use of the pressurizing-type lamp annealing device illustrated in FIG. 1.

Specifically, first, the amorphous PZT substrate is held at 450° C. for 5 minutes in a reduced-pressure atmosphere of $10^{-3}$ Torr, then the pressure is increased to 9.9 atm in an oxygen atmosphere, the substrate is heated up to 700° C. at a temperature-rise rate of 100° C./sec. and after holding the temperature for 5 minutes, the substrate is cooled to room temperature for fabrication of Sample 1 (Reduced Pressure+Pressurization).

In addition, an amorphous PZT substrate is held at 450° C. for 5 minutes in an atmospheric pressure oxide atmosphere, which is then pressurized to 9.9 atm in an oxygen atmosphere and is heated up to 700° C. at a temperature-rise rate of 100° C./sec, and after holding the temperature for 5 minutes, the substrate is cooled to room temperature for fabrication of Sample 2 (Atmospheric pressure+Pressurization). Comparison between Sample 1 and Sample 2 made it possible to obtain the following result.

Figure 4:
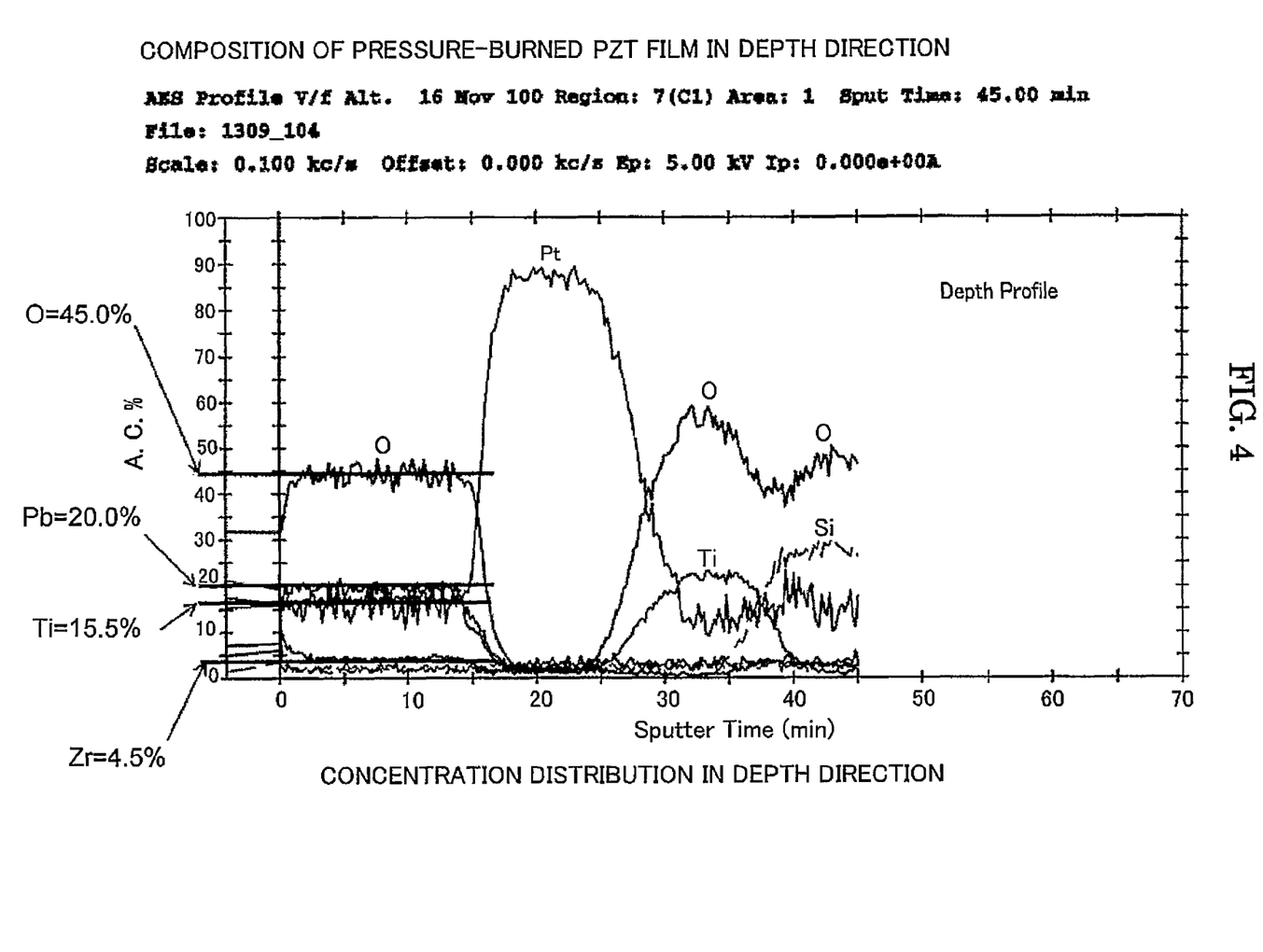
FIG. 4 is a graph illustrating the composition of a pressure-fired PZT film (Sample 1) in the depth direction.
Figure 6:
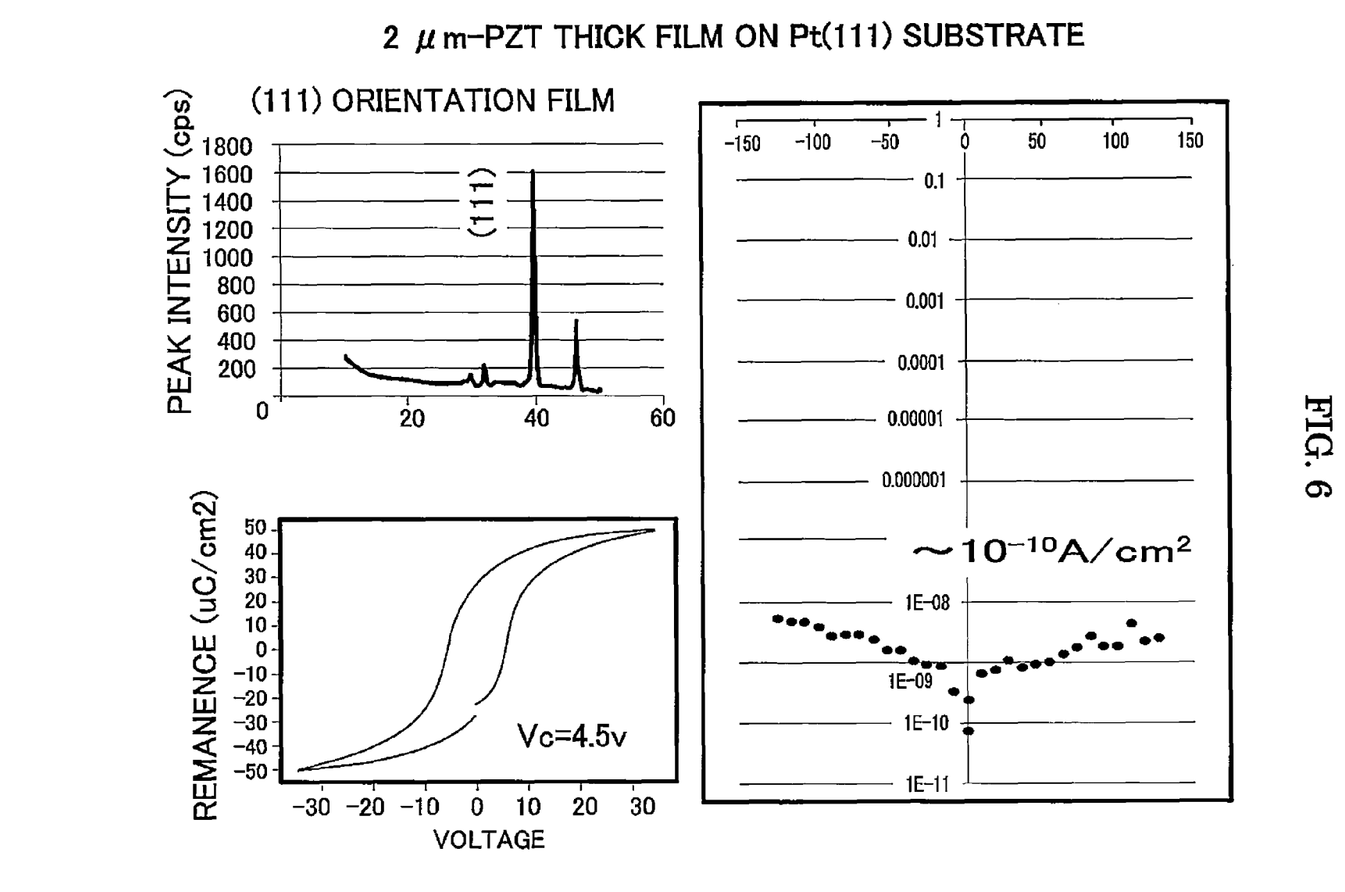
FIG. 6 shows graphs, each illustrating the orientation, the hysteresis curve, and the leak current density of a 2 PZT thick film (Sample 1) on a Pt(111) substrate.

As illustrated in FIG. 4, Sample 1 has Pb: (Zr+Ti)=1:1, giving stoichiometric composition. Furthermore, as illustrated in FIG. 6, the PZT thick film of Sample 1 exhibits an excellent (111) orientation, and also exhibits an excellent hysteresis curve and excellent insulation performance having a leak current density of $10^{-10}$ A/cm².

Figure 5:
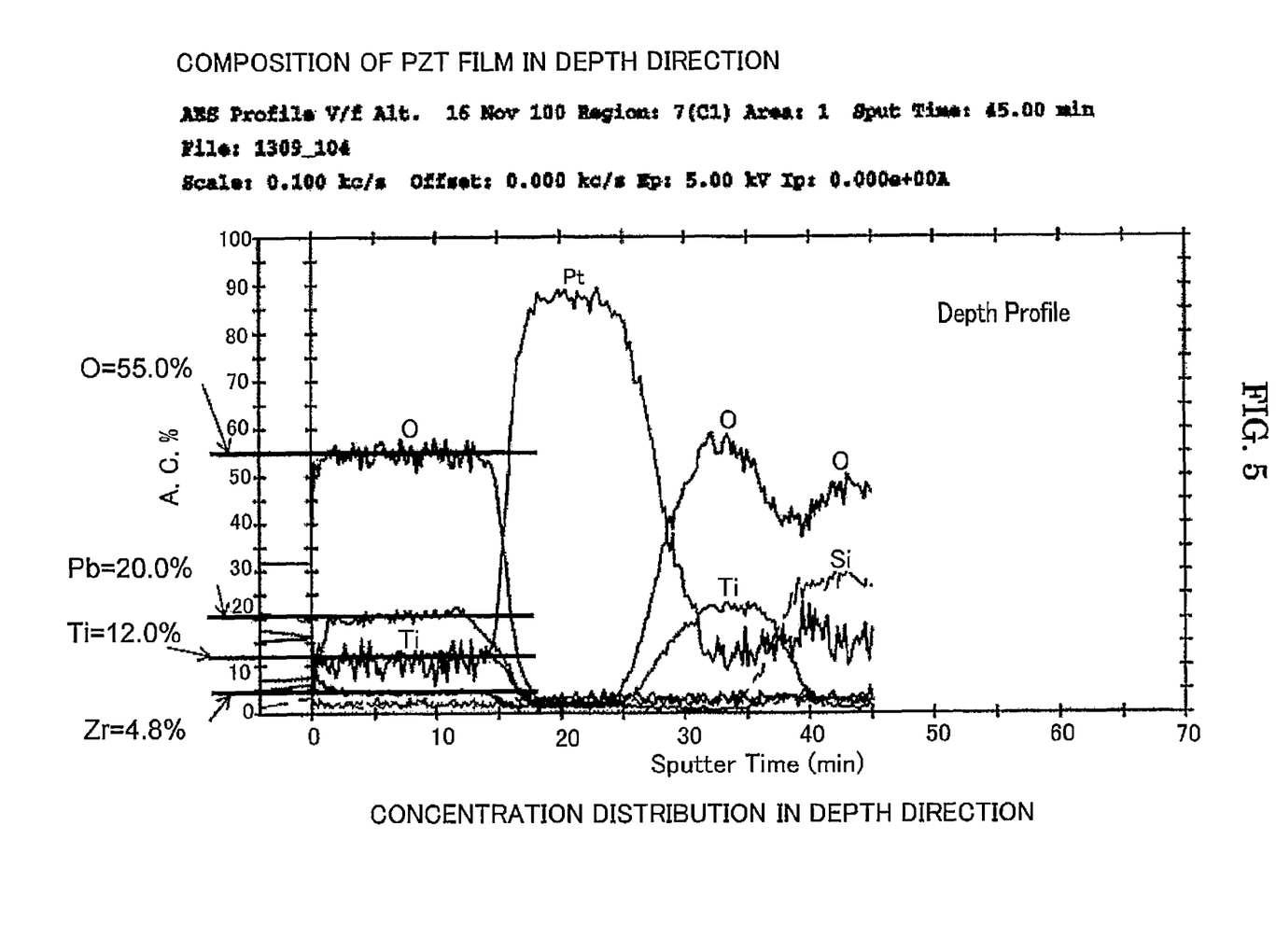
FIG. 5 is a graph illustrating the composition of a PZT film (Sample 2) in the depth direction.
Figure 9:
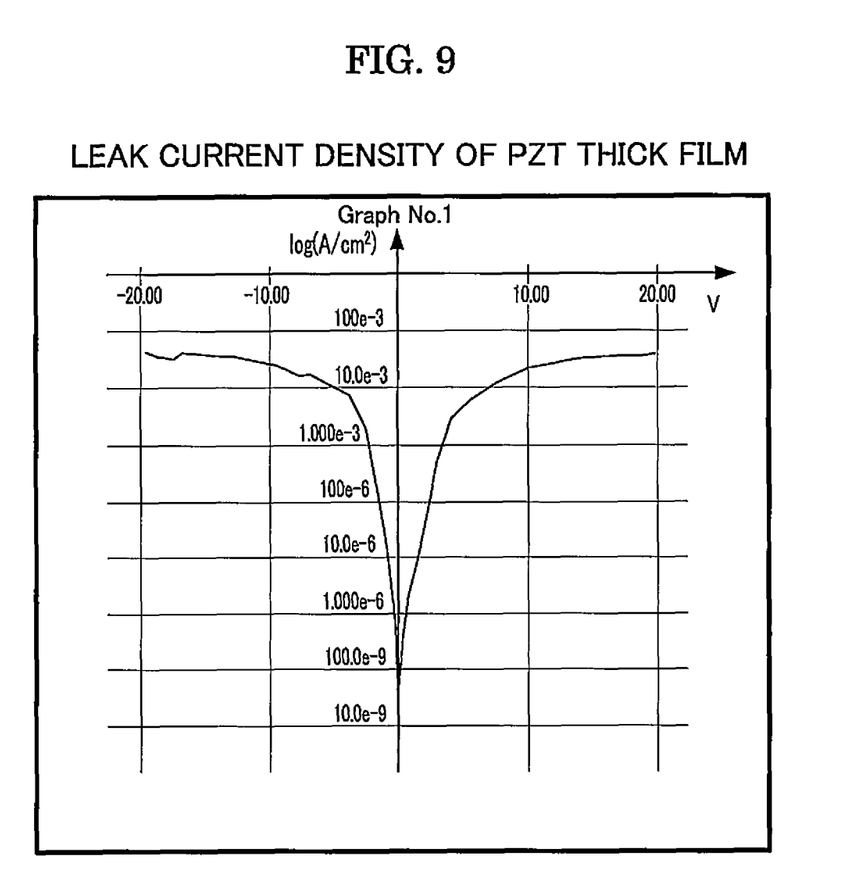
FIG. 9 is a graph illustrating the leak current density of the PZT thick film of Sample 2.

In contrast, in the case of Sample 2, as illustrated in FIG. 5, the Pb:(Zr+Ti) ratio is not 1:1, and it was found that an excessive amount of lead exists. In addition, the oxygen content is also large, and thus it is confirmed that PbO exists at grain boundaries. It can be seen that the presence of an excessive amount of lead causes larger leak current density than that of Sample 1, as shown in FIG. 9.

Figure 7:
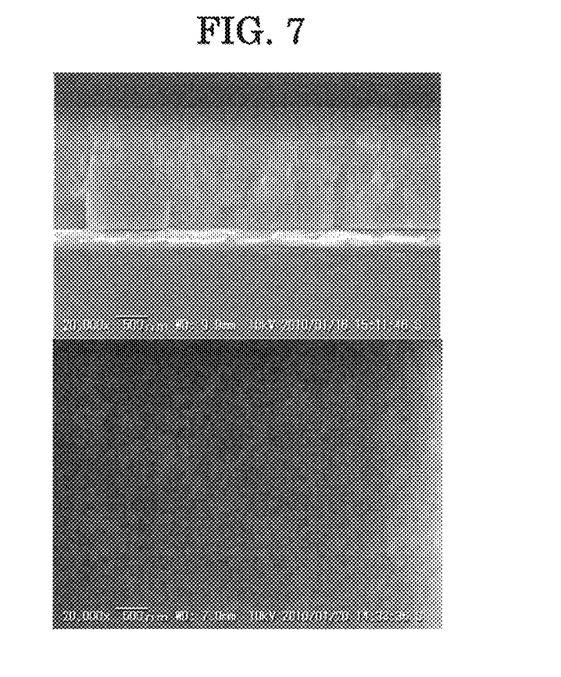
FIG. 7 is an SEM image illustrating a cross-section of the PZT thick film of Sample 1.
Figure 8:
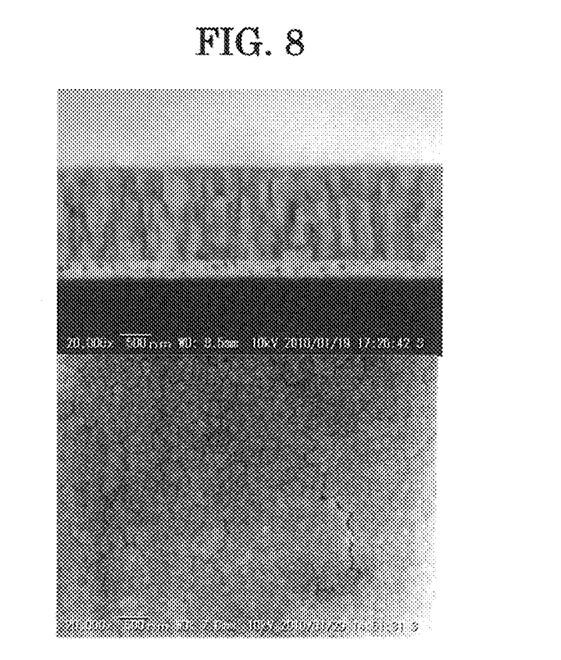
FIG. 8 is an SEM image illustrating a cross-section of the PZT thick film of Sample 2.

One of the factors supporting the difference in the characteristics between Sample 1 and Sample 2 is the difference in the crystal density, from the cross-sectional images shown in FIG. 7 and FIG. 8, and particularly in the PZT of Sample 2 shown in FIG. 8, it was confirmed that many grain boundaries exist at SEM level and furthermore, the many cracks exist from the surface image, which proved the presence of shape leak.

That is, at the time of reduced-pressure condition, as described below, the organic ingredients are effectively removed from the amorphous PZT which has a strong reducing power and which contains large amounts of organic substances.

At the time of reduced-pressure condition: $2Pb(Zr,Ti)O_3 + 3C \rightarrow 3CO_2\uparrow + 2Pb + 2(Zr,Ti)$ Then, in a pressurized oxygen atmosphere, the PZT oxidation is accelerated, further presumably the organic residue is removed as $CO_2$, and an excessive amount of lead is effectively removed as PbO, as described below.

At the time of pressurized condition: $2Pb + 2(Zr,Ti) + 3O_2 \rightarrow 2Pb(Zr,Ti)O_3$ (2) Process of Reduced Pressure+Atmospheric Pressure+ Pressurization (Sample 3), Process of Reduced Pressure+ Pressurization (Sample 4)

A spin coating is conducted through the use of a (Ba,Sr)TiO₃ sol-gel solution made up of ethanol solvent and having a concentration of 0.5 mol/kg, in which excessive barium ingredients by 15% are contained. Onto a 4-inch wafer having a (111)-oriented Pt film on the surface thereof, 300 μL of the solution is coated per cycle by rotational coating at 2500 rpm for 60 seconds. Next, the coated wafer is heated and held for 60 seconds on a hot plate held at 150° C., and water is removed therefrom. And then, the wafer is heated and held for 60 seconds on a hot plate held at 300° C., and an amorphous BST is generated. The steps are repeated for total 8 times, and thus a BST amorphous having a thickness of 500 nm is generated.

Next, the amorphous BST substrate after being temporary burning undergoes BST crystallization through the use of the pressurizing-type lamp annealing device illustrated in FIG. 1.

Specifically, first, the amorphous BST substrate is held at 500° C. for 5 minutes in a reduced-pressure atmosphere of $10^{-3}$ Torr, then oxygen gas is introduced to hold the atmospheric pressure for 5 minutes while holding the temperature of 500° C., followed by the pressure being increased to 9.9 atm in an oxygen atmosphere. After that, the substrate is heated up to 700° C. at a temperature-rise rate of 100° C./sec. After holding the temperature for 5 minutes, the substrate is cooled to room temperature for fabrication of Sample 3 (Reduced Pressure+Atmospheric Pressure+Pressurization).

In addition, an amorphous BST substrate is held at 500° C. for 5 minutes in a reduced-pressure atmosphere of $10^{-3}$ Torr, which is then pressurized to 9.9 atm in an oxygen atmosphere and is heated up to 700° C. at a temperature-rise rate of 100° C./sec, and after holding the temperature for 5 minutes, the substrate is cooled to room temperature for fabrication of Sample 4 (Reduced Pressure+Pressurization). Comparison between Sample 3 and Sample 4 made it possible to obtain the following result.

Figure 10:
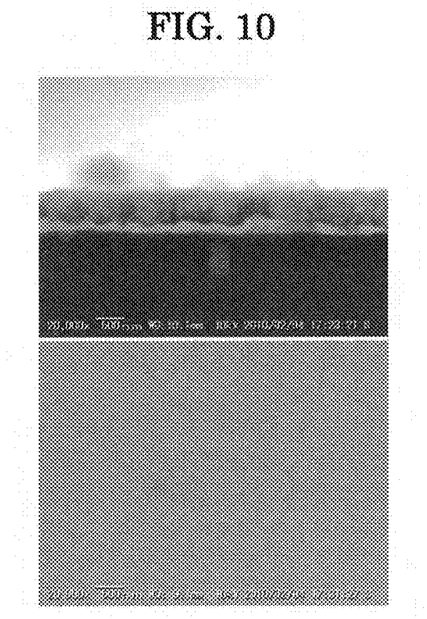
FIG. 10 is an SEM image illustrating a cross-section of a BST thick film of Sample 3.

In the case of Sample 3, as illustrated in FIG. 10, there is formed a BST film having highly dense and smooth surface, and having an excellent high-dielectric constant of 250, and there are observed large grains and boundaries which are densely packed, and particles which are also densely packed. Consequently, it was found that both good crystallinity and surface properties are able to be obtained at the same time by performing homogeneous oxidation through a slow and weak oxidization power under atmospheric pressure, followed by performing strong oxidation in a pressurized atmosphere.

Figure 11:
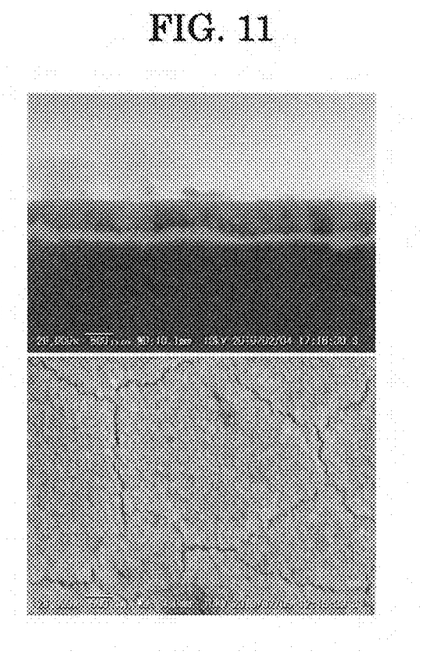
FIG. 11 is an SEM image illustrating a cross-section of a BST thick film of Sample 4.

In contrast, in the case of Sample 4, as illustrated in FIG. 11, although a dense configuration is formed, the grain shape is definitive, the presence of boundaries is also definitive, and an almost crack-like shape is exhibited. As a result, there appeared a large leak current presumably caused by the shape, and thus the sample failed in determining the dielectric constant which was not able to be determined.

Meanwhile, according to the embodiment, there have been given examples including the one performing reduced-pressure annealing treatment followed by pressure annealing treatment, the one performing atmospheric pressure annealing treatment followed by pressure annealing treatment, and the one performing reduced-pressure annealing treatment, atmospheric pressure annealing treatment, and then pressure annealing treatment, but the invention is not limited to these examples, and following applications are also possible.

There can also be performed any of reduced-pressure annealing treatment, atmospheric pressure annealing treatment, and pressure annealing treatment through the use of the pressurizing-type lamp annealing device shown in FIG. 1.

Furthermore, there can also be performed two of reduced-pressure annealing treatment, atmospheric pressure annealing treatment, and pressure annealing treatment through the use of the pressurizing-type lamp annealing device shown in FIG. 1, and in that case, any treatment may be first applied.

Moreover, there can also be performed reduced-pressure annealing treatment, atmospheric pressure annealing treatment, and pressure annealing treatment through the use of the pressurizing-type lamp annealing device shown in FIG. 1, and in that case, the treatment may be performed in various sequential application order.

DESCRIPTION OF THE REFERENCE SYMBOLS 4 quartz glass
4a near-cylindrical part
4b flange part
6 casing
7 gas-discharge duct
8 calcium fluoride
9 radiation thermometer
11 height of treatment chamber
12 pressurizing line
13 Argon gas supply source
14-16 check valve
17, 30, 46a filter
18 groove
19, 5 lamp heater
20 transparent tube
20a an end of transparent tube
20b other end of transparent tube
21, 1 chamber
21a, 1a inner surface of chamber
21b upper inner wall
22, 2 wafer
23, 3 stage
24 valve
25, 55 treatment chamber
26a first casing
26b second casing
27 regulator
28 O-ring
29 oxygen gas supply source
31-33 mass flow controller
34-36 valve
37 heating unit
38 nitrogen gas supply source
39 variable valve
40 pressure gauge
41, 42 release valve
43 leak valve
44 check valve
45 nitrogen gas supply source
47-49 pressure gauge
50, 53a valve
51, 52 piping
53, 54 regulator
69 valve
70 vacuum pump

The invention claimed is:

1. A method for producing a thin film comprising the steps of:
    preparing a substrate to be treated having an organic metal material on a surface thereof;
    performing annealing treatment on said organic metal material in a reduced-pressure atmosphere through the use of a pressurizing-type lamp annealing device; and
    performing oxidation treatment on said organic metal material in a pressurized oxygen atmosphere through the use of the pressurizing-type lamp annealing device,
    the pressurizing-type lamp annealing device comprising:
        a treatment chamber;
        a holding part disposed into said treatment chamber to hold a substrate to be treated;
        a gas-introduction mechanism for introducing a pressurized oxygen gas into said treatment chamber;
        a gas-discharge mechanism for discharging the gas in said treatment chamber;
        a transparent tube disposed into said treatment chamber; and
        a lamp heater placed in said transparent tube to irradiate said substrate to be treated with a lamp light, through said transparent tube,
    wherein said transparent tube has a thickness that is sufficient to withstand 9.9 atm.

2. The method for producing a thin film according to claim 1, wherein
    said oxidation treatment is a treatment in which:
    said gas-introduction mechanism sets the inside of said chamber to a pressurized atmosphere; and
    said lamp heater irradiates said organic metal material with said lamp light, through said transparent tube.

3. The method for producing a thin film according to claim 1, wherein:

a annealing treatment is performed in which,
said gas-discharge mechanism sets the inside of said chamber to a reduced-pressure atmosphere; and
said lamp heater irradiates said organic metal material with said lamp light, through said transparent tube.

4. The method for producing a thin film according to claim 1, wherein:
an atmospheric pressure oxidation treatment is performed in which,
between said annealing treatment and said oxidation treatment, the inside of said chamber is set to an atmospheric pressure atmosphere; and
said lamp heater irradiates said organic metal material with said lamp light, through said transparent tube.

5. A method for producing a thin film comprising the steps of:
preparing a substrate to be treated having an organic metal material on a surface thereof; and
performing annealing treatment on said organic metal material in a reduced-pressure atmosphere through the use of a pressurizing-type lamp annealing device; and
performing oxidation treatment on said organic metal material in a pressurized oxygen atmosphere through the use of the pressurizing-type lamp annealing device,
the pressurizing-type lamp annealing device comprising:
a chamber;
a holding part disposed into said chamber to hold a substrate to be treated positioned at a lower part of said chamber;
a gas-introduction mechanism for introducing a pressurized oxygen gas into said chamber;
a gas-discharge mechanism for discharging the gas in said chamber;
a transparent tube disposed into said chamber; and
a lamp heater placed in said transparent tube,
wherein:
a groove is formed on an upper inner wall of said chamber, the inner wall of said groove has a curved face along the outer surface of said transparent tube;
said transparent tube is disposed into said groove in a state where the outer surface thereof contacts said curved face;
said transparent tube has a thickness that is sufficient to withstand 9.9 atm,
each end of said transparent tube is connected to outside of said chamber; and
said substrate to be treated held by said holding part is irradiated with a lamp light of said lamp heater, through said transparent tube.

6. The method for producing a thin film according to claim 1, wherein:
an inner wall of said treatment chamber has a curved face along an outer surface of said transparent tube; and
said transparent tube is disposed so that the outer surface thereof contacts said curved face.

7. The method for producing a thin film according to claim 1, wherein each end of said transparent tube is connected to an outside of said treatment chamber.

8. The method for producing a thin film according to claim 5, wherein:
an atmospheric pressure oxidation treatment is performed in which, between said annealing treatment and said oxidation treatment, the inside of said chamber is set to an atmospheric pressure atmosphere; and
said lamp heater irradiates said organic metal material with said lamp light, through said transparent tube.

9. The method for producing a thin film according to claim 1, wherein said organic metal material is a PZT (lead zirconate titanate) material.

10. The method for producing a thin film according to claim 5, wherein said organic metal material is a PZT (lead zirconate titanate) material.

11. A method for producing a thin film comprising the steps of:
preparing a substrate to be treated having an organic metal material on a surface thereof;
performing annealing treatment on said organic metal material in a reduced-pressure atmosphere through the use of a pressurizing-type lamp annealing device, wherein the reduced pressure atmosphere is a vacuum state; and
performing oxidation treatment on said organic metal material in a pressurized oxygen atmosphere through the use of the pressurizing-type lamp annealing device,
the pressurizing-type lamp annealing device comprising:
a treatment chamber;
a holding part disposed into said treatment chamber to hold a substrate to be treated;
a gas-introduction mechanism for introducing a pressurized oxygen gas into said treatment chamber;
a gas-discharge mechanism for discharging the gas in said treatment chamber;
a transparent tube disposed into said treatment chamber; and
a lamp heater placed in said transparent tube to irradiate said substrate to be treated with a lamp light, through said transparent tube,
wherein said transparent tube has a thickness that is sufficient to withstand 9.9 atm.

\* \* \* \* \*